United States Patent

[11] 3,593,181

[72] Inventor Hans Kuhn
Oberer Wingertweg, Germany
[21] Appl. No. 874,164
[22] Filed Nov. 5, 1969
[45] Patented July 13, 1971
[73] Assignee International Standard Electric Corporation
New York, N.Y.
[32] Priority Nov. 15, 1968
[33] Germany
[31] P 18 09 005.6

[54] OSCILLATOR SYSTEM
4 Claims, 2 Drawing Figs.

[52] U.S. Cl. .......... 331/12, 331/9
[51] Int. Cl. .......... H03b 3/04
[50] Field of Search .......... 331/1—36

*Primary Examiner*—John Kominski
*Attorneys*—C. Cornell Remsen, Jr., Walter J. Baum, Paul W. Hemminger, Percy P. Lantzy, Philip M. Bolton, Isidore Togut and Charles L. Johnson, Jr.

ABSTRACT: To minimize the noise of an oscillator whose frequency is controlled by a reference signal via a control loop, the output of the oscillator is applied to the two inputs of a phase demodulator via a high-Q tuned circuit and a 90° phase shifter respectively. In one embodiment the phase demodulator output is coupled via a high pass filter into the usual frequency controlling loop. In a second embodiment, the DC component in the control loop is coupled via a reactance stage into the high-Q tuned circuit.

INVENTOR
HANS KUHN
BY [signature]
ATTORNEY

OSCILLATOR SYSTEM

BACKGROUND OF THE INVENTION

The present invention relates to an oscillator system having an oscillator whose frequency is retuned to a highly constant reference signal via a control loop, and more particularly to such a system in which the noise of the oscillator is reduced.

It has become customary to generate a desired frequency with a free-running oscillator, and to effect the retuning thereof, via a control loop, to a highly constant reference signal. When a high quality oscillator circuit having a small noise component is used, the lock-in range of the retuning is too small. If, however, a lower quality type of oscillator circuit is used, the lock-in band width increases, but the noise also increases.

It has been proved insufficient in many cases for the regulated oscillator to be followed by a narrow band filter.

It has been proved that the phase noise of a free-running oscillator can be reduced by applying a highly constant synchronizing signal, but this is limited by the signal-to-noise ratio corresponding to the applied high constant signal.

SUMMARY OF THE INVENTION

It is an object of the present invention to provide an oscillator system which reduces the noise of an oscillator signal to a greater extent than existing methods without constricting the lock-in range of the retuning.

According to the broader aspects of the invention I have provided an oscillator system for reducing the noise of an oscillator which comprises an oscillator, a source of a reference frequency, means for comparing the output of said oscillator with said reference frequency to produce a DC control voltage, a phase demodulator having two inputs, a high-Q oscillator circuit coupled between said oscillator output and one of said inputs, a phase shifter coupled between said oscillator output and the other said inputs, and means for applying said DC voltage and the output of said phase demodulator to control said oscillator.

The foregoing and other objects of the invention will be better understood from the following description and reference to the accompanying drawings, in which:

DESCRIPTION OF THE PREFERRED EMBODIMENTS

Figure 1:
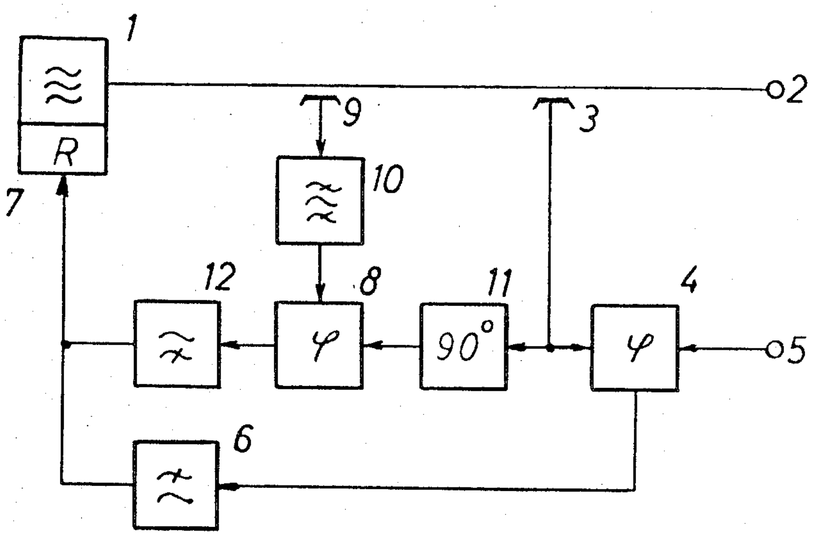
FIG. 1 shows a circuit comprising separate control loops.

Referring to FIG. 1, oscillator 1 supplies the signal as required to output terminal 2. Via coupling element 3, phase discriminator 4 receives the oscillator frequency at a first input thereof, and a highly constant reference frequency at a second input thereof via terminal 5. The control voltage that results from the phase comparison will reach reactance stage 7 of oscillator 1 via low pass filter 6.

The oscillator frequency, via coupling element 9 and a high Q-type of oscillating circuit 10 which is tuned to the oscillator frequency, is applied to a first input of phase demodulator 8, and the oscillator frequency via coupling element 3 and 90° phase shifter 11, is applied to the second input of phase demodulator 8. The output signal of demodulator 8 is applied, via high pass filter 12, to reactance stage 7 of oscillator 1. Owing to the tuning of the high Q-type oscillating circuit 10, all individual frequencies of the noise spectrum which are not in agreement with the nominal or rated frequency of the oscillator, generate an output signal for phase demodulator 8. Since the DC component of demodulator 8 is blocked by high pass filter 12, only the demodulated noise voltages are applied to reactance stage 7, and if properly polarized, will effect a compensation leading to a considerable reduction of the noise component of the oscillator signal as occurring at terminal 2.

Figure 2:
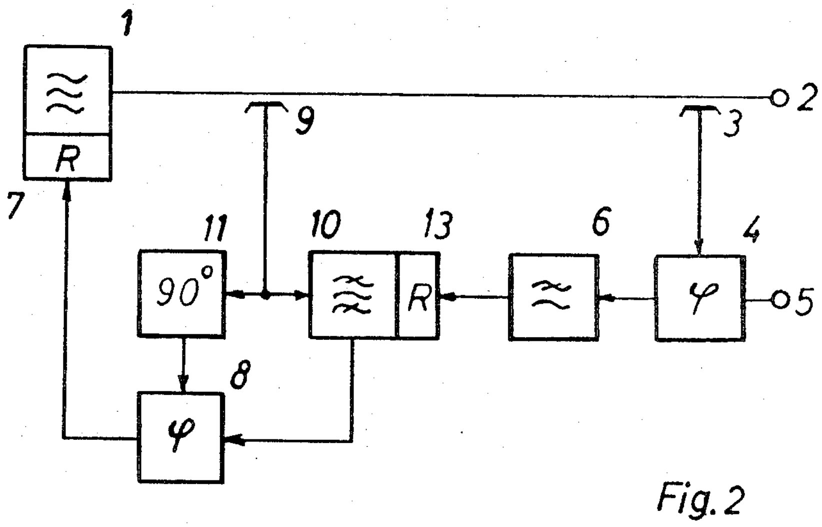
FIG. 2 shows a circuit in which the retuning is effected via the high Q-type of oscillator circuit.

In FIG. 2, in which a second embodiment of the inventive circuit is shown, the stages indicated by the same reference numerals perform the same functions as those in the circuit of FIG. 1. Reactance stage 13 is coupled to the high Q-type of oscillating circuit 10. Reactance stage 13 is acted upon, via low pass filter 6, by the retuning voltage of the phase discriminator. In this way, oscillating circuit 10 is retuned, and the noise signal compensation is no longer effected by the frequency deviations thereof. High pass filter 12 is no longer required because the retuning signal at reactance stage 7 contains the DC voltage component as well as the demodulated noise voltage.

I claim:

1. An oscillator system comprising:
   - an oscillator;
   - a source of a reference frequency;
   - means for comparing the output of said oscillator with said reference frequency to produce a DC control voltage;
   - a phase demodulator having two inputs;
   - a high-Q oscillator circuit coupled between said oscillator output and one of said inputs;
   - a phase shifter coupled between said oscillator output and the other said inputs; and
   - means for applying said DC voltage and the output of said phase demodulator to control said oscillator.

2. An oscillator system according to claim 1 wherein said means for applying said DC voltage includes:
   - a reactance stage controlling said oscillator;
   - means for directly applying said DC voltage to said reactance stage; and
   - means including a high pass filter for connecting the output of said phase demodulator to said reactance stage.

3. An oscillator system according to claim 1 wherein said means for applying includes:
   - a first reactance stage for tuning said high-Q oscillator circuit;
   - means for applying said DC voltage to said first reactance stage;
   - a second reactance stage contolling said oscillator; and
   - means for applying the output of said phase demodulator to said second reactance stage.

4. An oscillator system according to claim 1 wherein said phase shifter is a 90° phase shifter.